United States Patent
Kim et al.

(10) Patent No.: US 10,253,187 B2
(45) Date of Patent: Apr. 9, 2019

(54) NANO-STRUCTURE OF BLOCK COPOLYMER AND METHOD OF MANUFACTURING THE SAME

(71) Applicants: Mi-Jeong Kim, Hwaseong-si (KR); Yeon-Sik Jung, Daejeon (KR); Woon-Ik Park, Busan (KR); Jae-Won Jeong, Daejeon (KR)

(72) Inventors: Mi-Jeong Kim, Hwaseong-si (KR); Yeon-Sik Jung, Daejeon (KR); Woon-Ik Park, Busan (KR); Jae-Won Jeong, Daejeon (KR)

(73) Assignees: SAMSUNG ELECTRONICS CO., LTD., Gyeonggi-Do (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 1111 days.

(21) Appl. No.: 13/627,782

(22) Filed: Sep. 26, 2012

(65) Prior Publication Data
US 2013/0224442 A1    Aug. 29, 2013

(30) Foreign Application Priority Data
Nov. 8, 2011 (KR) .................. 10-2011-0116111

(51) Int. Cl.
| | | |
|---|---|---|
| C09D 5/00 | (2006.01) | |
| C09D 153/00 | (2006.01) | |
| H01L 21/033 | (2006.01) | |
| B81C 1/00 | (2006.01) | |
| G03F 7/00 | (2006.01) | |
| B82Y 40/00 | (2011.01) | |

(52) U.S. Cl.
CPC ............ *C09D 5/00* (2013.01); *B81C 1/00031* (2013.01); *C09D 153/00* (2013.01); *G03F 7/0002* (2013.01); *H01L 21/0337* (2013.01); *B81C 2201/0149* (2013.01); *B82Y 40/00* (2013.01); *Y10T 428/24612* (2015.01)

(58) Field of Classification Search
CPC .............. C09D 153/00; H01L 21/0337; Y10T 428/24612
USPC ........................................................ 428/220
See application file for complete search history.

(56) References Cited

U.S. PATENT DOCUMENTS

| | | | |
|---|---|---|---|
| 3,821,148 A | * | 6/1974 | Makowski et al. .. C08K 5/0016 524/145 |
| 7,605,081 B2 | | 10/2009 | Yang et al. |
| 7,750,341 B2 | * | 7/2010 | Yang et al. ..................... 257/40 |
| 7,851,252 B2 | | 12/2010 | Nealey et al. |
| 2005/0136258 A1 | * | 6/2005 | Nie .................. A61K 47/48861 428/402 |
| 2007/0064468 A1 | * | 3/2007 | Seol et al. ..................... 365/129 |
| 2008/0193658 A1 | | 8/2008 | Millward |
| 2009/0087664 A1 | | 4/2009 | Nealey et al. |
| 2009/0281242 A1 | | 11/2009 | Landis |
| 2010/0075116 A1 | | 3/2010 | Russell et al. |
| 2010/0148156 A1 | * | 6/2010 | Jang et al. ..................... 257/40 |
| 2011/0097559 A1 | | 4/2011 | Hawker et al. |
| 2011/0104452 A1 | | 5/2011 | Grozea et al. |

FOREIGN PATENT DOCUMENTS

| | | |
|---|---|---|
| KR | 2010-0011184 A | 2/2010 |
| WO | 2008097736 A2 | 8/2008 |

OTHER PUBLICATIONS

Jung et al (Nano Letters), 2007.*
Clarke, C.J. et al., Measurements of the Flory-Huggins Interaction Parameter for Polystyrene-Poly(4-vinylpyridine) Blends, Macromolecules, 1997, vol. 30(14): 4184-4188.
Jung, Y. S. et al., Solvent-Vapor-Induced Tunability of Self-Assembled Block Copolymer Patterns, Adv. Mater. 2009, vol. 21(24): 2540-2545.
Valkama, S. et al., Self-Assembled Structures in Diblock Copolymers with Hydrogen-Bonded Amphiphilic Plasticizing Compounds, Macromolecules, 2006, 39: 9327-9336.
J.H. Maas et al. "Preparation of polystyrene brushes by reaction of terminal vinyl groups on silicon and silica surfaces", Thin Solid Films 426 (2003) 135-139.

* cited by examiner

*Primary Examiner* — Lawrence D Ferguson
(74) *Attorney, Agent, or Firm* — Cantor Colburn LLP

(57) ABSTRACT

A nano-structured block copolymer that includes a self-assembled block copolymer disposed on a substrate, wherein the block copolymer includes a plurality of block structural units, and at least two block structural units have a solubility parameter difference of greater than or equal to about 5 megaPascal$^{1/2}$.

12 Claims, 7 Drawing Sheets

NANO-STRUCTURE OF BLOCK COPOLYMER AND METHOD OF MANUFACTURING THE SAME

CROSS-REFERENCE TO RELATED APPLICATION

This application claims priority to and the benefit of Korean Patent Application No. 10-2011-0116111, filed on Nov. 8, 2011, and all the benefits accruing therefrom under 35 U.S.C. § 119, the contents of which is incorporated herein in its entirety by reference.

BACKGROUND

1. Field

This disclosure relates to a nano-structured block copolymer, and a method of manufacturing the same.

2. Description of the Related Art

A memory device or logic device fabrication technology involves high-precision circuitry, and patterning technology is the core part of the integrated circuit and the resultant devices. Currently, optical lithography uses for a semiconductor device fabrication process due to simple process and freedom of pattern tunability. Not surprisingly, it has taken a core part of the patterning process for the past 50 years. However, as we enter an ultra high-level information society utilizing mobile computing devices in its daily life, there are demands for new patterning technology to increase degree of integration and device performance.

In the conventional optical lithography, a sub-22 nanometer pattern is theoretically and technically impossible due to the technical limitation in resolution originating from the wavelength of light. To overcome the problem, processes such as an electron beam (e-beam) lithography process, an X-ray beam lithography process, an EUV optical lithography process, and the like have been researched and developed. Still, the major drawback of the lithography processes is that they require expensive equipment. Also, the lithography processes using an electron beam and an X-ray beam require a long scanning time and have difficulty in forming a pattern of less than or equal to about 10 nanometers. In addition, the EUV optical lithography needs the development of a new photosensitive photoresist material.

To solve the problems, a patterning technology using a self-assembly phenomenon of a block copolymer has been developed as the next-generation lithography process. The technology is expected to be the next-generation lithography process that may overcome the limitation of photolithography in pattern resolution by removing a particular block and transferring the pattern of a block copolymer onto a functional material such as a metal, an oxide, and a polymer through deposition and etching processes.

SUMMARY

One embodiment provides a nano-structured block copolymer that may have a decreased pattern resolution of less than or equal to about 10 nanometers ("nm"), and has a pattern of small line edge roughness.

Another embodiment provides a method for manufacturing a nano-structured block copolymer being capable of providing patterns of various morphologies and sizes.

According to an embodiment, a nano-structured block copolymer includes a self-assembled block copolymer disposed on a substrate, wherein the block copolymer includes a plurality of block structural units, and at least two block structural units have a solubility parameter difference of greater than or equal to about 5 megaPascal$^{1/2}$ ("MPa$^{1/2}$").

At least two block structural units may have at least two block structural units have a solubility parameter difference of about 5 MPa$^{1/2}$ to about 38 MPa$^{1/2}$.

The block copolymer may have a Flory-Huggins interaction parameter ($\chi$) of greater than or equal to about 0.7.

The first block structural unit of a plurality of block structural units of the block copolymer may include a functional group selected from a heteroatom-containing aromatic functional group, a heteroatom-containing alicyclic functional group, a heteroatom-containing aliphatic functional group, a hydroxy group (—OH), an amine group (—NRR', wherein R and R' are each independently hydrogen, a C1 to C20 alkyl group, a C2 to C20 alkenyl group, or a C6 to C20 aryl group), an amide group (—NHC(=O)R, wherein R is hydrogen, a C1 to C20 alkyl group, or a C2 to C20 alkenyl group), a carbonyl group (—C(=O)R, wherein R is hydrogen, a C1 to C20 alkyl group, or a C2 to C20 alkenyl group), an ester group (—C(=O)R, wherein R is hydrogen, a C1 to C20 alkyl group, or a C2 to C20 alkenyl group), a cyano group (—CN), a (meth)acryloyloxy group, and a combination thereof, optionally wherein a metal is coordination-bonded with the foregoing functional groups, in either a main chain or a side chain of the first block structural unit.

The first block structural unit of a plurality of block structural units of the block copolymer may include a structural unit represented by Chemical Formula 1 or 2:

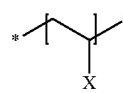

Chemical Formula 1

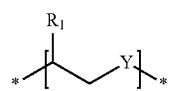

Chemical Formula 2

In Chemical Formula 1,

X is selected from a heteroatom-containing aromatic functional group wherein the heteroatom is selected from O, S, and NR (wherein R is hydrogen, a C1 to C20 alkyl group, or a C2 to C20 alkenyl group), a heteroatom-containing alicyclic functional group wherein the heteroatom is selected from O, S, and NRR' (wherein R and R' are independently hydrogen, a C1 to C20 alkyl group, or a C2 to C20 alkenyl group), a heteroatom-containing aliphatic functional group wherein the heteroatom is selected from O, S, and NRR' (wherein R and R' are independently hydrogen, a C1 to C20 alkyl group, or a C2 to C20 alkenyl group), a hydroxy group (—OH), an amine group (—NRR', wherein R and R' are each independently hydrogen, a C1 to C20 alkyl group, a C2 to C20 alkenyl group, or a C6 to C20 aryl group), an amide group (—NHC(=O)R, wherein R is hydrogen, a C1 to C20 alkyl group, or a C2 to C20 alkenyl group), a carbonyl group (—C(=O)R, wherein R is hydrogen, a C1 to C20 alkyl group, or a C2 to C20 alkenyl group), an ester group (—C(=O)R, wherein R is hydrogen, a C1 to C20 alkyl group, or a C2 to C20 alkenyl group), a cyano group (—CN), and a (meth)acryloyloxy group, optionally wherein a metal is coordination-bonded with the foregoing functional groups, and in Chemical Formula 2, Y is selected from O, S, and NR wherein R is hydrogen, a C1 to C20 alkyl group, or a C2 to C20 alkenyl group, and $R^1$ is hydrogen or a methyl group.

The first block structural unit of a plurality of block structural units of the block copolymer may include poly(acrylonitrile), poly(methacrylonitrile), poly(ethylene oxide), poly(propylene oxide), poly(ethylene sulfide), poly(propylene sulfide), poly(ethylene imine), poly(2-vinylpyridine), poly(4-vinylpyridine), or poly(methyl(meth)acrylate).

Examples of the heteroatom-containing aromatic functional group and the heteroatom-containing alicyclic functional group may include monovalent or higher valency functional groups represented by the following Chemical Formula 3.

Chemical Formula 3

 (1)

 (2)

 (3)

 (4)

 (5)

 (6)

 (7)

 (8)

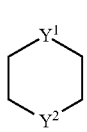 (9)

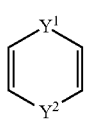 (10)

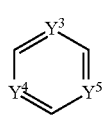 (11)

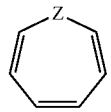 (12)

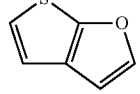 (13)

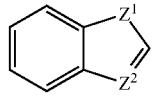 (14)

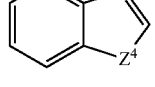 (15)

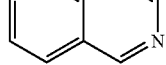 (16)

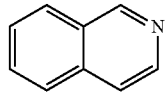 (17)

In (1), (4), (5), and (6) of Chemical Formula 3, X is NR (wherein R is hydrogen, a C1 to C20 alkyl group, or a C2 to C20 alkenyl group), O, and S, in (7) of Chemical Formula 3, $X^1$ is selected from $CR^1R^2$ (wherein $R^1$ and $R^2$ are each independently hydrogen, a C1 to C20 alkyl group, or a C2 to C20 alkenyl group), NR (wherein R is hydrogen, a C1 to C20 alkyl group, or a C2 to C20 alkenyl group), O, and S, and $X^2$ to $X^5$ are N or $CR^1$ (wherein $R^1$ is hydrogen, a C1 to C20 alkyl group, or a C2 to C20 alkenyl group), provided that at least one of $X^2$ to $X^5$ is N when $X^1$ is $CR^1R^2$, in (8) of Chemical Formula 3, $X^1$ is selected from $CR^1R^2$ (wherein $R^1$ and $R^2$ are each independently hydrogen, a C1 to C20 alkyl group, or a C2 to C20 alkenyl group), NR (wherein R is hydrogen, a C1 to C20 alkyl group, or a C2 to C20 alkenyl group), O, and S, and $X^2$ is N or $CR^1$ (wherein $R^1$ is hydrogen, a C1 to C20 alkyl group, or a C2 to C20 alkenyl group), provided that $X^2$ is N when $X^1$ is $CR^1R^2$, in (9) and (10) of Chemical Formula 3, $Y^1$ and $Y^2$ are selected from $CR^1R^2$ (wherein $R^1$ and $R^2$ are each independently hydrogen, a C1 to C20 alkyl group, or a C2 to C20 alkenyl group), NR (wherein R is hydrogen, a C1 to C20 alkyl group, or a C2 to C20 alkenyl group), O, and S, provided that at least one of $Y^1$ and $Y^2$ is NR, O, or S, in (11) of Chemical Formula 3, $Y^3$ to $Y^5$ are selected from $CR^1$ (wherein $R^1$ is hydrogen, a C1 to C20 alkyl group, or a C2 to C20 alkenyl group) and N, provided that at least one of $Y^3$ to $Y^5$ is N, in (12) of Chemical Formula 3, Z is selected from NR (wherein R is hydrogen, a C1 to C20 alkyl group, or a C2 to C20 alkenyl group), O, and S, and in (14) and (15) of Chemical Formula 3, $Z^1$ and $Z^4$ are selected from $CR^1R^2$ (wherein $R^1$ and $R^2$ are each independently hydrogen, a C1 to C20 alkyl group, or a C2 to C20 alkenyl group), N, O, and S, and $Z^2$ and $Z^3$ are selected from $CR^1$ (wherein $R^1$ is hydrogen, a C1 to C20 alkyl group, or a C2 to C20 alkenyl group) and N, provided that $Z^2$ and $Z^3$ are N when $Z^1$ and $Z^4$ are $CR^1R^2$, and $Z^1$ and $Z^4$ are selected from N, O, and S when $Z^2$ and $Z^3$ are $CR^1$.

The second block structural unit of a plurality of block structural units of the block copolymer may include a polystyrene, a polydiene, a polyolefin, a nylon, or a polysiloxane comprising a C1 to C20 alkyl group or a C6 to C30 aryl group, specifically a C1 to C12 alkyl group or a C6 to C18 aryl group.

The block copolymer may include polyacrylonitrile-b-polydimethylsiloxane, polyethyleneoxide-b-polydimethylsiloxane, poly(2-vinylpyridine)-b-polydimethylsiloxane, poly(4-vinylpyridine)-b-polydimethylsiloxane, polymethyl methacrylate-b-polydimethyl siloxane, polyacrylonitrile-b-polypropylene, polyethyleneoxide-b-polypropylene, polyacrylonitrile-b-polyisobutylene, polyethyleneoxide-b-polyisobutylene, polyacrylonitrile-b-polyethylene, polyethyleneoxide-b-polyethylene, polyacrylonitrile-b-polyisoprene, polyethyleneoxide-b-polyisoprene, polyacrylonitrile-b-polychloroprene, polyethyleneoxide-b-polychloroprene, polyacrylonitrile-b-polystyrene, polyethyleneoxide-b-polystyrene, and the like.

The weight ratio of the first block structural unit and the second block structural unit may be from about 10:90 to about 90:10, specifically from about 30:70 to about 70:30.

The block copolymer may have a number average molecular weight (Mn) of about 5,000 Daltons ("Da") to about 100,000 Daltons, specifically about 10,000 to about 50,000. The block copolymer may have polydispersity index (Mw/Mn) of about 1 to about 1.2.

An organic mono-molecular layer, or a patterning subject layer and an organic mono-molecular layer, may be additionally present between the substrate and the self-assembled block copolymer.

The organic mono-molecular layer may be selected from a self-assembled monolayer ("SAM"), a polymer brush, and a cross-linked random copolymer mat ("MAT"). The polymer brush may be selected from a polysiloxane such as polydimethylsiloxane ("PDMS"), polystyrene ("PS"), a substituted polystyrene, a poly(alkyl(meth)acrylate) (e.g., polymethylmethacrylate), polystyrene-random-poly(methylmethacrylate) ("PS-random-PMMA"), and a combination thereof.

The patterning subject layer may be selected from an oxide layer, a nitride layer, an oxynitride layer, a doped polysilicon layer, a metal layer, and a combination thereof.

According to another embodiment, a method for manufacturing a nano-structured block copolymer includes: forming a block copolymer thin film on a substrate; forming a pattern by performing a solvent annealing process; and providing a nano-structure to the pattern by performing a plasma treatment to the pattern and removing the block structural units except a block structural unit where the pattern has been formed. Herein, the block copolymer includes a plurality of block structural units, and at least two block structural units of them have a solubility parameter difference of greater than or equal to about 5 $MPa^{1/2}$.

At least two block structural units may have a solubility parameter difference of about 5 $MPa^{1/2}$ to about 38 $MPa^{1/2}$.

The block copolymer may have a Flory-Huggins interaction parameter ($\chi$) of greater than or equal to about 0.7.

The block copolymer may include a first block structural unit and a second block structural unit, which is the same as described in the nano-structured block copolymer.

The annealing process may include exposing the block copolymer to vapor of a solvent and swelling the block structural unit of the block copolymer.

The solvent may include water, an aliphatic hydrocarbon, an aromatic hydrocarbon, a heteroatom-containing aromatic hydrocarbon, a ketone solvent, a carboxylic acid, an amide solvent, a monohydric alcohol, a polyhydric alcohol, and the like.

The solvent may have a solubility parameter of about 10 $MPa^{1/2}$ to about 50 $MPa^{1/2}$, specifically about 15 $MPa^{1/2}$ to about 48 $MPa^{1/2}$, and more specifically about 18 $MPa^{1/2}$ to about 35 $MPa^{1/2}$.

To provide a cylindrical pattern, the solubility parameter difference between the solvent and the first block structural unit of the block copolymer may be less than or equal to about 15 $MPa^{1/2}$, specifically from about 0 $MPa^{1/2}$ to about 13 $MPa^{1/2}$. The cylindrical pattern may have a line width of about 1 to about 50 nm. The cylindrical pattern may provide structure tunability of about 200% to about 500% by using a block copolymer of the same molecular weight and controlling the solubility parameter of the first block structural unit between the solvent and the block copolymer.

To provide a spherical pattern, the solubility parameter difference between the solvent and the first block structural unit of the block copolymer may be less than or equal to about 2 $MPa^{1/2}$.

The vapor of the solvent may be provided at a vapor pressure of about 0.01 kPa to about 17 kPa.

An organic mono-molecular layer, or a patterning subject layer and an organic mono-molecular layer, may be further formed on the substrate.

The nano-structure may have morphology selected from lamellar, hexagonally perforated lamellar ("HPL"), cylindrical, and spherical.

The annealing process may be performed at a temperature of about 0° C. to about 300° C.

When the first block structural unit further includes a coordination-bonded metal, a metal pattern or a pattern of a metal oxide may be provided on the region from which the first block structural unit is removed.

DETAILED DESCRIPTION

Figure 1:
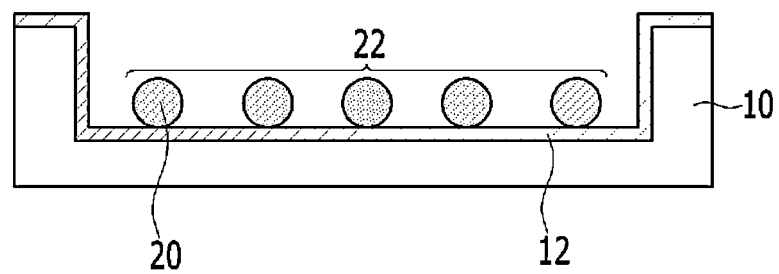
FIG. 1 is a schematic view of a nano-structured block copolymer according to an embodiment.

This disclosure will be described more fully in the following detailed description of the invention, and with reference to the accompanying drawings, in which some but not all embodiments of the disclosure are described. This disclosure may, however, be embodied in many different forms and is not to be construed as limited to the exemplary embodiments set forth herein; rather, these embodiments are provided so that this disclosure will be thorough and complete, and will fully convey the scope of the invention to those skilled in the art. Like reference numerals and variables refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, when a definition is not otherwise provided, the term "substituted" means a hydrogen atom (e.g., 1, 2, 3, or 4 hydrogen atoms) substituted with a group selected from a halogen (F, Br, Cl, or I), a hydroxyl group (—OH), an alkoxy group (—OR wherein R is a C1-C20 alkyl group, a C2-C20 alkenyl group, or a C2-C20 alkynyl group), a cyano group (—CN), a nitro group (—NO$_2$), an amino group (—NH$_2$), an amidino group (—C(=NH)NHR wherein R is a hydrogen, C1-C20 alkyl group, a C2-C20 alkenyl group, or a C2-C20 alkynyl group), an ester group (—CO$_2$R wherein R is a C1-C20 alkyl group, a C2-C20 alkenyl group, or a C2-C20 alkynyl group), a hydrazine group (—NH—NHR wherein R is a hydrogen, C1-C20 alkyl group, a C2-C20 alkenyl group, or a C2-C20 alkynyl group), a hydrazone group (—C=N—NHR wherein R is a hydrogen, C1-C20 alkyl group, a C2-C20 alkenyl group, or a C2-C20 alkynyl group), a carboxyl group (—CO$_2$H), a sulfonic acid group (—SO$_3$H), a phosphoric acid group (—PO$_3$H), a C1-C20 alkyl group, a C2-C20 alkenyl group, a C2-C20 alkynyl group, and a combination thereof, provided that the valence of the moiety being substituted is not exceeded.

"Alkyl" as used herein means a straight or branched chain saturated aliphatic hydrocarbon having the specified number of carbon atoms, specifically 1 to 12 carbon atoms, more specifically 1 to 6 carbon atoms.

"Alkenyl" as used herein means a straight or branched chain, monovalent hydrocarbon group having at least one carbon-carbon double bond (e.g., ethenyl (—HC=CH$_2$)).

"Aryl" as used herein means a cyclic moiety in which all ring members are carbon and at least one ring is aromatic, the moiety having the specified number of carbon atoms, specifically 6 to 24 carbon atoms, more specifically 6 to 12 carbon atoms. More than one ring may be present, and any additional rings may be independently aromatic, saturated or partially unsaturated, and may be fused, pendant, spirocyclic or a combination thereof.

"Aliphatic hydrocarbon" as used herein means a hydrocarbon compound containing carbon and hydrogen joined together in straight chains, joined chains, or non-aromatic rings.

In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the term "combination thereof" may refer to mixtures, stacked structures, composites, alloys, and the like. Furthermore, a "combination thereof" may include a named component or element together with a like element or component that is not named As used herein, the term "(meth)acrylate" may refer to an acrylate and a methacrylate, and the term "(meth)acryloyloxy" may refer to an acryloyloxy and a methacryloyloxy.

Hereinafter, referring to FIG. 1, the nano-structured block copolymer is described.

FIG. 1 is a schematic view of a nano-structured block copolymer according to an embodiment.

According to an embodiment, a nano-structured block copolymer 20 includes a substrate 10 and a self-assembled block copolymer disposed on the substrate 10, wherein the block copolymer includes a plurality of block structural units having a solubility parameter difference of greater than or equal to about 5 megaPascal$^{1/2}$ ("MPa$^{1/2}$"). The nano-structure 20 forms a nano-structure pattern 22 having a predetermined shape.

A plurality of trenches formed on the substrate 10 may be used as guides for formation, e.g., self-assembling of the block copolymer therein. FIG. 1 shows a shape of the trenches, but the scope of this disclosure is not limited to the shape and the trenches may be formed in diverse shapes. The shape of the substrate 10 may be formed through soft lithography such as a near-field phase shifting lithography, photolithography, or electron beam lithography. The substrate 10 may be formed of silicon (Si), gallium arsenide, or polydimethylsiloxane ("PDMS"), but is not limited thereto.

An organic mono-molecular layer 12 may be further disposed on the substrate 10. The organic mono-molecular layer 12 may be an imaging layer, and it may be formed of a patterned or selectively activated material. In accordance with an embodiment, the organic mono-molecular layer 12 may be selected from a self-assembled monolayer ("SAM"), a polymer brush, and a cross-linked random copolymer mat ("MAT"). The presence of the organic mono-molecular layer 12 allows a self-assembled nano-structured block copolymer that is formed on the organic mono-molecular layer 12 to be stably arrayed in a predetermined direction.

The self-assembled monolayer may be formed using a compound selected from pentyltrichlorosilane ("PETCS"), phenyltrichlorosilane ("PTCS"), benzyltrichlorosilane ("BZTCS"), tolyltrichlorosilane ("TTCS"), 2-[(trimethoxysilyl)ethyl]-2-pyridine ("PYRTMS"), 4-biphenylyltrimethoxysilane ("BPTMS"), octadecyltrichlorosilane ("OTS"), 1-naphthyltrimethoxysilane ("NAPTMS"), 1-[(trimethoxysilyl)methyl]naphthalene ("MNATMS"), (9-methylanthracenyl)trimethoxysilane ("MANTMS"), hexamethyldisilazane ("HMDS"), aminopropyltriethoxysilane, 4-mercaptopyridine, aminoethanethiol, and a combination thereof.

The polymer brush may be selected from a polysiloxane such as polydimethylsiloxane ("PDMS"), polystyrene ("PS"), substituted polystyrene, poly(meth)acrylate (e.g., polymethylmethacrylate), (polystyrene-random-poly(methylmethacrylate)) silane ("PS-random-PMMA silane"), and a combination thereof. The polymer brush means a polymer that may be covalently bonded to the substrate 10.

The MAT may be a benzocyclobutene-functionalized polystyrene-r-poly(methylmethacrylate)) copolymer ("PS-r-BCB-r-MMA)").

The organic mono-molecular layer 12 may be omitted depending on the kind of the substrate 10.

A patterning subject layer to be patterned, such as an oxide layer, a nitride layer, an oxynitride layer, a doped polysilicon layer, and a metal layer may be disposed between the substrate 10 and the organic mono-molecular layer 12.

The block copolymer is a polymer obtained by connecting at least two block structural units having different chemical properties through a covalent bond. The block copolymer may be self-assembled to form a microdomain having a uniform size of several to tens of nanometers in order to minimize thermodynamic energy.

However, when a generally known block copolymer is used, it is difficult to form a pattern in a size less than or equal to about 10 nanometers (nm), and there is a limitation in obtaining long-range ordering over a wide area of several to scores of micrometers that is required in the actual fabrication of a device. As shown in the following Equation 1, the size ($\lambda$) of the domain of the block copolymer is in proportion to $N^{2/3}$ wherein N is the number of the repeating units of the block copolymer. Therefore, to form a pattern of less than or equal to about 10 nm, the molecular weight of the block copolymer related to the number of the repeating units of the block copolymer is decreased according to the pattern size. However, when the molecular weight is decreased, the phase segregation strength, which is the driving force of self-assembly, is reduced, which is not desirable.

$$\lambda_{eq} \sim aN^{2/3}\chi_{wet}^{1/6} \quad \text{Equation 1}$$

In Equation 1, $\lambda$ denotes a domain size (domain spacing); N denotes the number of the repeating units of a block copolymer; $\chi_{wet}$ denotes a Flory-Huggins interaction parameter of a block copolymer in a solvent; and parameter a denotes a Kuhn step length.

Therefore, in an embodiment of this disclosure, a desired domain size may be obtained while securing phase segregation strength by not changing the molecular weight of the block copolymer and increasing the Flory-Huggins interaction parameter ($\chi$). The Flory-Huggins interaction parameter ($\chi$) is a value related to the solubility parameter difference between the block structural units of the block copolymer. In an embodiment of this disclosure, a block copolymer having a solubility parameter difference between at least two block structural units of greater than or equal to about 5 $MPa^{1/2}$ is used. According to another embodiment, a block copolymer having a solubility parameter difference of about 5 $MPa^{1/2}$ to about 38 $MPa^{1/2}$ is used. According to yet another embodiment, a block copolymer having a solubility parameter difference of about 7 $MPa^{1/2}$ to about 22 $MPa^{1/2}$ is used. When a pattern is formed using a block copolymer having a solubility parameter difference of the at least two block structural units of greater than or equal to about 5 $MPa^{1/2}$, pattern resolution may be reduced to less than or equal to about 10 nm, and line edge roughness may be improved as well.

When the solubility parameter difference of the at least two block structural units is controlled to fall in the range, the Flory-Huggins interaction parameter ($\chi$) of the block copolymer has a value of greater than or equal to about 0.7, specifically about 0.7 to about 42, more specifically about 1 to about 14. The $\chi$ value may be measured by SAXS (small angle X-ray scattering). The $\chi$ value is measured by controlling the size distribution ($\Delta\lambda/\lambda$) of the 1.4888 Å X-ray wavelength and domain to be about 1%. When a block copolymer having an $\chi$ of the range is used, the size of the domain of the block copolymer is decreased, and thereby the pattern resolution may be reduced to less than or equal to about 10 nm.

The first block structural unit of a plurality of block structural units of the block copolymer may include a heteroatom-containing aromatic functional group, a heteroatom-containing alicyclic functional group, a heteroatom-containing aliphatic functional group, a hydroxy group (—OH), an amine group (—NRR', wherein R and R' are each independently hydrogen or hydrogen, a C1 to C20 alkyl group, a C1 to C20 alkenyl group, or a C6 to C12 aryl group), an amide group (—NHC(=O)R, wherein R is hydrogen, a C1 to C20 alkyl group, or a C1 to C20 alkenyl group), a carbonyl group (—C(=O)R, wherein R is hydrogen, a C1 to C20 alkyl group, or a C1 to C20 alkenyl group), an ester group (—C(=O)R, wherein R is hydrogen, a C1 to C20 alkyl group, or a C2 to C20 alkenyl group), a cyano group (—CN), a (meth)acryloyloxy group, and a combination thereof, in a main chain or a side chain of the first block structural unit, or both. The foregoing functional groups show polarity due to unshared electron pairs of N, O, or S, and hydrophilicity.

The heteroatom-containing aromatic functional group may include a heteroatom of N, O, or S, and the heteroatom-containing aromatic functional group may be a 5- to 7-membered aromatic functional group including N, O, or S. Herein, "aromatic functional group" means a functional group in which all elements of a cyclic substituent have a p-orbit, and the p-orbit forms conjugation. Examples of an aromatic functional group include a C6 to C30 aryl group (6-membered benzene ring or fused ring thereof) or a C2 to C25 hetero aryl group (5-membered to 7-membered hetero ring or a fused ring thereof). The heteroatom-containing alicyclic functional group as used herein means a 5- to 7-membered alicyclic functional group including N, O, or S (e.g., a C3 to C20 cycloalkyl group or a C3 to C20 cycloalkenyl group).

When the first block structural unit of a plurality of block structural units includes the heteroatom-containing aromatic functional group or the heteroatom-containing alicyclic functional group, these groups may include monovalent or higher valency functional groups represented by the following Chemical Formula 3. The point(s) of attachment of the groups of Chemical Formula 3 below may be at any atom, provided that the valency of the atom is not exceeded. In an embodiment, the group is monovalent or divalent.

Chemical Formula 3

 (1)

 (2)

 (3)

 (4)

 (5)

 (6)

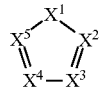 (7)

 (8)

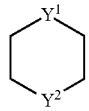 (9)

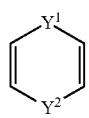 (10)

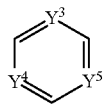 (11)

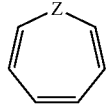 (12)

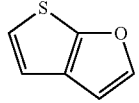 (13)

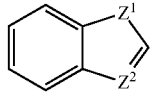 (14)

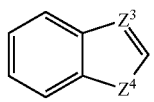 (15)

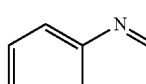 (16)

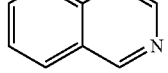 (17)

In (1), (4), (5), and (6) of Chemical Formula 3, X is NR (wherein R is hydrogen, a C1 to C20 alkyl group, or a C2 to C20 alkenyl group), O, and S, in (7) of Chemical Formula 3, $X^1$ is selected from $CR^1R^2$ (wherein $R^1$ and $R^2$ are each independently hydrogen, a C1 to C20 alkyl group, or a C2 to C20 alkenyl group), NR (wherein R is hydrogen, a C1 to C20 alkyl group, or a C2 to C20 alkenyl group), O, and S, and $X^2$ to $X^5$ are N or $CR^1$ (wherein $R^1$ is hydrogen, a C1 to C20 alkyl group, or a C2 to C20 alkenyl group), provided that at least one of $X^2$ to $X^5$ is N when $X^1$ is $CR^1R^2$, in (8) of Chemical Formula 3, $X^1$ is selected from $CR^1R^2$ (wherein $R^1$ and $R^2$ are each independently hydrogen, a C1 to C20 alkyl group, or a C2 to C20 alkenyl group), NR (wherein R is hydrogen, a C1 to C20 alkyl group, or a C2 to C20 alkenyl group), O, and S, and $X^2$ is N or $CR^1$ (wherein $R^1$ is hydrogen, a C1 to C20 alkyl group, or a C2 to C20 alkenyl group), provided that $X^2$ is N when $X^1$ is $CR^1R^2$, in (9) and (10) of Chemical Formula 3, $Y^1$ and $Y^2$ are selected from $CR^1R^2$ (wherein $R^1$ and $R^2$ are each independently hydrogen, a C1 to C20 alkyl group, or a C2 to C20 alkenyl group), NR (wherein R is hydrogen, a C1 to C20 alkyl group, or a C2 to C20 alkenyl group), O, and S, provided that at least one of $Y^1$ and $Y^2$ is NR, O, or S, in (11) of Chemical Formula 3, $Y^3$ to $Y^5$ are selected from $CR^1$ (wherein $R^1$ is hydrogen, a C1 to C20 alkyl group, or a C2 to C20 alkenyl group) and N, provided that at least one of $Y^3$ to $Y^5$ is N, in (12) of Chemical Formula 3, Z is selected from NR (wherein R is hydrogen, a C1 to C20 alkyl group, or a C2 to C20 alkenyl group), O, and S, and in (14) and (15) of Chemical Formula 3, $Z^1$ and $Z^4$ are selected from $CR^1R^2$ (wherein $R^1$ and $R^2$ are each independently hydrogen, a C1 to C20 alkyl group, or a C2 to C20 alkenyl group), N, O, and S, and $Z^2$ and $Z^3$ are selected from $CR^1$ (wherein $R^1$ is hydrogen, a C1 to C20 alkyl group, or a C2 to C20 alkenyl group) and N, provided that $Z^2$ and $Z^3$ are N when $Z^1$ and $Z^4$ are $CR^1R^2$, and $Z^1$ and $Z^4$ are selected from N, O, and S when $Z^2$ and $Z^3$ are $CR^1$.

The heteroatom-containing aliphatic functional group as used herein means a C1 to C20 aliphatic group including N, O, or S. The heteroatom may be located at a point of attachment of the functional group.

When the first block structural unit of a plurality of block structural units include the heteroatom-containing alicyclic functional groups, these groups may include monovalent or divalent groups such as —OR (wherein R is a C1 to C20 alkyl group or a C2 to C20 alkenyl group), —OR'— (wherein R' is a C1 to C20 alkylene group or a C2 to C20 alkenylene group), —SR (wherein R is a C1 to C20 alkyl group or a C2 to C20 alkenyl group), —SR'— (wherein R' is a C1 to C20 alkylene group or a C2 to C20 alkenylene group), or NRR' (wherein R and R' are a C1 to C20 alkyl group, a C2 to C20 alkenyl group, a C1 to C20 alkylene group or a C2 to C20 alkenylene group).

In some embodiments, the first block structural unit of a plurality of block structural units of the block copolymer may include a structural unit represented by the following Chemical Formula 1 or 2:

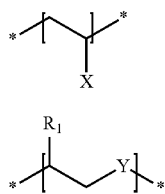

Chemical Formula 1

Chemical Formula 2

In Chemical Formula 1,

X is selected from a heteroatom-containing aromatic functional group wherein the heteroatom is selected from O, S, and NR (wherein R is hydrogen, a C1 to C20 alkyl group, or a C2 to C20 alkenyl group), a heteroatom-containing alicyclic functional group wherein the heteroatom is selected from O, S, and NRR' (wherein R and R' are independently hydrogen, a C1 to C20 alkyl group, or a C2 to C20 alkenyl group), a heteroatom-containing aliphatic functional group wherein the heteroatom is selected from O, S, and NRR' (wherein R and R' are independently hydrogen, a C1 to C20 alkyl group, or a C2 to C20 alkenyl group), a hydroxy group (—OH), an amine group (—NRR', wherein R and R' are each independently hydrogen, a C1 to C20 alkyl group, a C2 to C20 alkenyl group, or a C6 to C20 aryl group), an amide group (—NHC(=O)R, wherein R is hydrogen, a C1 to C20 alkyl group, or a C2 to C20 alkenyl group), a carbonyl group (—C(=O)R, wherein R is hydrogen, a C1 to C20 alkyl group, or a C2 to C20 alkenyl group), an ester group (—C(=O)R, wherein R is hydrogen, a C1 to C20 alkyl group, or a C2 to C20 alkenyl group), a cyano group (—CN), a (meth)acryloyloxy group, and a combination thereof, optionally wherein a metal is coordination-bonded with the foregoing functional groups, and in Chemical Formula 2, Y is selected from O, S, and NR wherein R is hydrogen, a C1 to C20 alkyl group, or a C2 to C20 alkenyl group, and $R^1$ is hydrogen or a methyl group.

Examples of the heteroatom-containing aromatic functional group and the heteroatom-containing alicyclic functional group in Chemical Formula 1 may include monovalent and divalent functional groups represented by the following Chemical Formula 3. The point of attachment may be at any atom on the functional group, provided that the valence of the atom is not exceeded.

Chemical Formula 3

 (1)

 (2)

 (3)

 (4)

 (5)

 (6)

 (7)

 (8)

 (9)

 (10)

 (11)

 (12)

 (13)

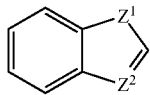

(14)

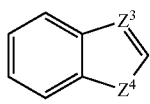

(15)

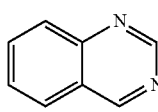

(16)

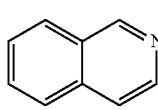

(17)

In (1), (4), (5), and (6) of Chemical Formula 3, X is NR (wherein R is hydrogen, a C1 to C20 alkyl group, or a C2 to C20 alkenyl group), O, or S, in (7) of Chemical Formula 3, $X^1$ is selected from $CR^1R^2$ (wherein $R^1$ and $R^2$ are each independently hydrogen, a C1 to C20 alkyl group, or a C2 to C20 alkenyl group), NR (wherein R is hydrogen, a C1 to C20 alkyl group, or a C2 to C20 alkenyl group), O, and S, and $X^2$ to $X^5$ are N or $CR^1$ (wherein $R^1$ is hydrogen, a C1 to C20 alkyl group, or a C2 to C20 alkenyl group), provided that at least one of $X^2$ to $X^5$ is N when $X^1$ is $CR^1R^2$, in (8) of Chemical Formula 3, $X^1$ is selected from $CR^1R^2$ (wherein $R^1$ and $R^2$ are each independently hydrogen, a C1 to C20 alkyl group, or a C2 to C20 alkenyl group), NR (wherein R is hydrogen, a C1 to C20 alkyl group, or a C2 to C20 alkenyl group), O, and S, and $X^2$ is N or $CR^1$ (wherein $R^1$ is hydrogen, a C1 to C20 alkyl group, or a C2 to C20 alkenyl group), provided that $X^2$ is N when $X^1$ is $CR^1R^2$, in (9) and (10) of Chemical Formula 3, $Y^1$ and $Y^2$ are selected from $CR^1R^2$ (wherein $R^1$ and $R^2$ are each independently hydrogen, a C1 to C20 alkyl group, or a C2 to C20 alkenyl group), NR (wherein R is hydrogen, a C1 to C20 alkyl group, or a C2 to C20 alkenyl group), O, and S, provided that at least one of $Y^1$ and $Y^2$ is NR, O, or S, in (11) of Chemical Formula 3, $Y^3$ to $Y^5$ are selected from $CR^1$ (wherein $R^1$ is hydrogen, a C1 to C20 alkyl group, or a C2 to C20 alkenyl group) and N, provided that at least one of $Y^3$ to $Y^5$ is N, in (12) of Chemical Formula 3, Z is selected from NR (wherein R is hydrogen, a C1 to C20 alkyl group, or a C2 to C20 alkenyl group), O, and S, and in (14) and (15) of Chemical Formula 3, $Z^1$ and $Z^4$ are selected from $CR^1R^2$ (wherein $R^1$ and $R^2$ are each independently hydrogen, a C1 to C20 alkyl group, or a C2 to C20 alkenyl group), N, O, and S, and $Z^2$ and $Z^3$ are selected from $CR^1$ (wherein $R^1$ is hydrogen, a C1 to C20 alkyl group, or a C2 to C20 alkenyl group) and N, provided that $Z^2$ and $Z^3$ are N when $Z^1$ and $Z^4$ are $CR^1R^2$, and $Z^1$ and $Z^4$ are selected from N, O, and S when $Z^2$ and $Z^3$ are $CR^1$.

At least one carbon including in rings of the above Chemical Formula 1 provides the block copolymer with a binding site.

Examples of the functional group having the structure of the above Chemical Formula 1 may include a pyridyl group, a pyrimidyl group, a triazinyl group, a thiazolyl group, an isothiazolyl group, a pyrazolyl group, an isoxazolyl group, a triazolyl group, and the like.

When X is the heteroatom-containing aliphatic functional group, it may be —OR (wherein R is a C1 to C20 alkyl group or a C2 to C20 alkenyl group), —OR'— (wherein R' is a C1 to C20 alkylene group or a C2 to C20 alkenylene group), —SR (wherein R is a C1 to C20 alkyl group or a C2 to C20 alkenyl group), or NRR' (wherein R and R' are a C1 to C20 alkyl group, a C2 to C20 alkenyl group, a C1 to C20 alkylene group or a C2 to C20 alkenylene group).

The heteroatom-containing aromatic functional group, heteroatom-containing alicyclic functional group, heteroatom-containing aliphatic functional group, hydroxy group, amine group, amide group, carbonyl group, cyano group, (meth)acryloyloxy group, and a combination thereof may be present in a main chain or side chain of the first block structural unit, or in both a main chain and a side chain of the first block structural unit.

The heteroatom-containing aromatic functional group, heteroatom-containing alicyclic functional group, heteroatom-containing aliphatic functional group, hydroxy group, amine group, amide group, carbonyl group, cyano group, or (meth)acryloyloxy group include unshared electron pairs and may be coordination-bonded with a metal. The metal may be a transition element, a Group 13 element, or a Group 14 element, for example, gold (Au), silver (Ag), platinum (Pt), copper (Cu), nickel (Ni), iron (Fe), titanium (Ti), aluminum (Al), tin (Sn), or a combination thereof.

The first block structural unit may have a glass transition temperature of higher than or equal to room temperature (which is about 24° C. to about 26° C.), specifically about 50° C. to about 150° C.

The second block structural unit of a plurality of block structural units of the block copolymer may include a polystyrene, a polydiene, a polyolefin, nylon, or polysiloxane comprising a C1 to C20 alkyl group or a C6 to C30 aryl group, specifically a C1 to C12 alkyl group or a C6 to C18 aryl group. Such a second block structural unit is hydrophobic.

The polydiene may include 1,4-polybutadiene, 1,2-polybutadiene, polyisoprene, polychloroprene, a styrene-butadiene copolymer, acrylonitrile-butadiene copolymer, an ethylene-propylene-diene terpolymer, and the like, without limitation.

The polyolefin may include polyethylene, polypropylene, polyisobutylene, an ethylene-propylene copolymer, and the like, but is not limited thereto.

The polysiloxane comprising a C1 to C20 alkyl group or a C6 to C30 aryl group may include a polydialkylsiloxane such as polydimethylsiloxane, a polydiarylsiloxane such as polydiphenylsiloxane, a polyalkylarylsiloxane such as polymethylphenylsiloxane, and the like.

The block copolymer may include a diblock copolymer (i.e., a copolymer including two block structural units), a triblock copolymer (i.e., a copolymer including three block structural units), multi-block copolymer (i.e., a copolymer including four or more block structural units), and a combination thereof. The block copolymer may be a linear, graft, or star-type copolymer.

A diblock copolymer, which is substantially symmetrical, may be used in a self-assembling process to form a layer-type thin film, and an asymmetrical diblock copolymer may be used in a self-assembling process to form other structures such as a spherical structure, a cylindrical structure, a spiral structure, or a combination thereof.

The block copolymer may include polyacrylonitrile-b-polydimethylsiloxane, polyethyleneoxide-b-polydimethylsiloxane, poly(2-vinylpyridine)-b-polydimethylsiloxane, poly(4-vinylpyridine)-b-polydimethylsiloxane, polymethylmethacrylate-b-polydimethylsiloxane, polyacrylonitrile-b-polypropylene, polyethyleneoxide-b-polypropylene, polyacrylonitrile-b-polyisobutylene, polyethyleneoxide-b-polyisobutylene, polyacrylonitrile-b-polyethylene, polyethyleneoxide-b-polyethylene, polyacrylonitrile-b-polyisoprene, polyethyleneoxide-b-polyisoprene, polyacrylonitrile-b-poly(meth)acrylate, polyethyleneoxide-b-poly(meth)acrylate, polyacrylonitrile-b-polychloroprene, polyethyleneoxide-b-polychloroprene, polyacrylonitrile-b-polystyrene, polyethyleneoxide-b-polystyrene, polyacrylonitrile-b-polyvinylchloride, polyacrylonitrile-b-polyvinylacetate, polyacrylonitrile-b-poly(2-vinylpyridine), polyacrylonitrile-b-poly(4-vinylpyridine), and the like.

The weight ratio of the first block structural unit and the second block structural unit may be about 10:90 to about 90:10, and more specifically about 30:70 to about 70:30. When the ratio of the first block structural unit and the second block structural unit is in these ranges, process conditions may be easily controlled to form diverse patterns.

The block copolymer may have a number average molecular weight (Mn) of about 5,000 Daltons ("Da") to about 100,000 Da, specifically about 10,000 Da to about 50,000 Da. When the number average molecular weight is in the above ranges, process conditions may be easily controlled to form diverse patterns.

Figure 2:
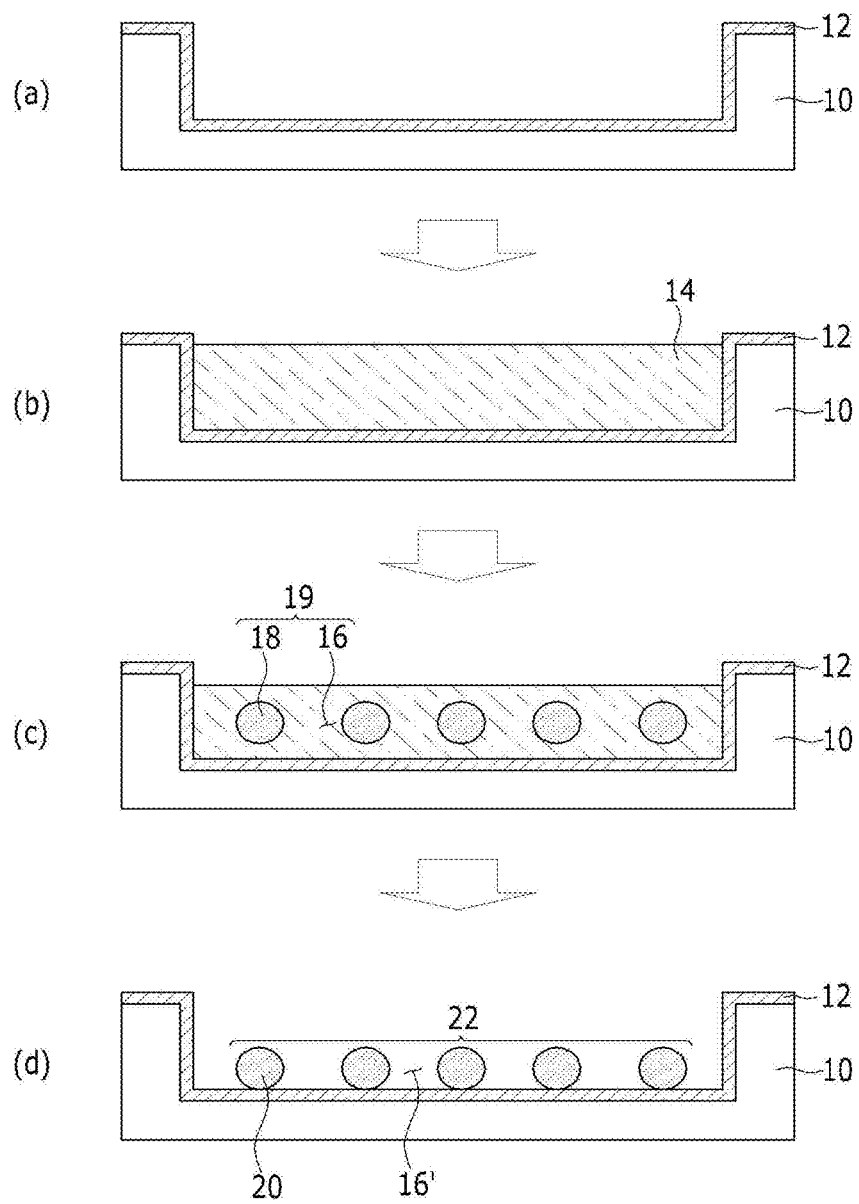
FIG. 2 is a schematic diagram illustrating a process of manufacturing a nano-structured block copolymer in accordance with another embodiment.

Hereinafter, a process for manufacturing a nano-structured block copolymer is described with reference to FIG. 2. FIG. 2 is a schematic diagram illustrating a process of manufacturing a nano-structured block copolymer in accordance with another embodiment.

The nano-structured block copolymer may be manufactured by (a) optionally, selectively forming an organic mono-molecular layer 12 on the substrate 10 including a plurality of trenches as shown in FIG. 2, (b) forming a block copolymer thin film 14 on the substrate or the organic mono-molecular layer 12 if present as shown in FIG. 2, (c) forming a pattern 19 by performing a solvent annealing process, and (d) forming a nano-structure 20 by removing the block structural units except the block structural unit that forms the pattern by performing a plasma process on the thin film containing the pattern. The block copolymer includes a plurality of block structural units, and the solubility parameter difference between at least two block structural units of the block structural units may be greater than or equal to about 5 $MPa^{1/2}$. Specifically, it may range from about 5 $MPa^{1/2}$ to about 38 $MPa^{1/2}$, and more specifically, it may range from about 7 $MPa^{1/2}$ to about 22 $MPa^{1/2}$.

The block copolymer thin film 14 may be formed by coating the substrate 10 with a composition obtained by dissolving or dispersing the block copolymer in a solvent, or when the organic mono-molecular layer 12 is formed on the substrate 10 as shown in FIG. 2, the block copolymer thin film 14 may be formed by coating the organic mono-molecular layer 12 with the composition. As the solvent for dissolving or dispersing the block copolymer, toluene, acetic acid, pyridine, dimethyl formamide, pentenol, methanol, or ethanol may be used, but the scope of this disclosure is not limited thereto. When the solvent is used, a homogenous solution or dispersion solution may be obtained. Thus, it is possible to apply the composition to a large area uniformly to provide a manufactured film having few defects. As for the coating method, spin coating, dip coating, spray coating, zone casting, or a combination thereof may be used.

The block copolymer thin film 14 is formed of a block copolymer whose solubility parameter difference between the block structural units is greater than or equal to about 5 $MPa^{1/2}$, specifically about 5 $MPa^{1/2}$ to about 38 $MPa^{1/2}$, more specifically about 7 $MPa^{1/2}$ to about 22 $MPa^{1/2}$, and a pattern 19 including the first block structural unit 16 and the second block structural unit 18 is formed by performing a solvent annealing process.

The solvent annealing process includes exposing the block copolymer to the vapor of the solvent and selectively swelling the block structural units of the block copolymer. Through the solvent annealing process, the mobility of the polymer chain of the block copolymer is increased and the self-assembly of the block copolymer is induced. FIG. 2 illustrates a spherical pattern 19, but diverse patterns such as lamellar and HPL may be formed based on the self-assembly of the block copolymer.

The solvent may be protic or aprotic and may be water; an organic solvent such as an aliphatic hydrocarbon such as heptane and hexane; an aromatic hydrocarbon such as benzene, toluene, and xylene; a heteroatom-containing aromatic hydrocarbon such as pyridine; a ketone solvent such as acetone, butanone, ethyl isopropyl ketone, isophorone, mesityl oxide, methyl isobutyl ketone, methyl isopropyl ketone, and methylethyl ketone; a carboxylic acid such as acetic acid; an amide such as dimethyl formamide dimethyl acetamide, formamide, N-methylformamide, N-methylpyrrolidone, 2-pyrrolidone, and N-vinylpyrrolidone; a monohydric alcohol such as methanol, ethanol, pentenol, and isopropylalcohol; a polyhydric alcohol such as propylene glycol and ethylene glycol; and the like.

The solvent may have a solubility parameter ranging from about 10 $MPa^{1/2}$ to about 50 $MPa^{1/2}$, specifically from about 15 $MPa^{1/2}$ to about 48 $MPa^{1/2}$, more specifically from about 18 $MPa^{1/2}$ to about 35 $MPa^{1/2}$. When the solvent has a solubility parameter in these ranges, a polymer having two block structural units of different solubility, referred to as a first block structural unit and a second block structural unit, may be dissolved together, providing mobility of a polymer chain so that a thermodynamic equilibrium state may be achieved.

The solvent selectively swells the first block structural unit 16 having a small solubility parameter difference relative to the solvent to enlarge the solubility parameter difference between the first block structural unit 16 and the second block structural unit 18 of the block copolymer. When a solvent having a similar solubility parameter to that of the first block structural unit 16 of the block copolymer is used, the Flory-Huggins interaction parameter ($\chi$) of the block copolymer is increased, and the size of the domain of the block copolymer may be decreased while maintaining phase segregation strength.

Since the value of the Flory-Huggins interaction parameter ($\chi$) may be changed by performing an annealing process using a solvent having excellent affinity for the first block structural unit 16, the morphology of the pattern and the size (which is the critical dimension (CD) or line width (line width) of the pattern) may be controlled. Since the solvent used in the annealing process is selectively implanted into a block structural unit having excellent affinity to expand the block structural unit, the volume fraction of each block structural unit becomes different. As described above, when the volume fraction becomes different, the morphology and size of the finally formed pattern are different.

Therefore, by using different kinds of solvent, patterns of diverse morphologies and sizes may be formed. In short, the swelling ratio of the first block structural unit may be controlled by selecting a solvent having a similar solubility parameter to that of the first block structural unit, and by doing so, a desired pattern size may be obtained without changing the molecular weight of the block copolymer. In an embodiment, the width of the pattern may be diversely controlled in a range of about 1 nm to about 50 nm, specifically about 1 nm to about 40 nm, more specifically about 1 nm to about 20, still more specifically about 1 nm to about 10 nm.

For example, in order to provide a cylindrical pattern, the solubility parameter difference between the solvent and the first block structural unit 16 of the block copolymer may be less than or equal to about 15 $MPa^{1/2}$, specifically from about 0 $MPa^{1/2}$ to about 13 $MPa^{1/2}$. In this case, cylindrical patterns of diverse sizes having a line width of about 1 nm to about 50 nm, specifically about 1 nm to about 40 nm, more specifically about 1 nm to about 20, still more specifically about 1 nm to about 10 nm may be easily formed, while not changing the molecular weight of the block copolymer. The cylindrical pattern may provide a structure tunability value of about 200% to about 500%, specifically about 300% to 500%, by controlling the solubility parameter difference between the solvent and the first block structural unit of the block copolymer while using a block copolymer of the same molecular weight. Herein, the structure tenability value is what the changed extent of the maximal line width ($LW_{max}$) based on the minimal line width ($LW_{min}$) is expressed as a percentage based on the following Equation 2. Since the wide structure tenability improves the flexibility of a pattern, the process is simplified and it is appropriate for mass production.

$$LW_{max}/LW_{min} \times 100 \qquad \text{Equation 2}$$

Also, to provide a spherical pattern, the solubility parameter difference between the solvent and the first block structural unit 16 of the block copolymer may be less than or equal to about 2 $MPa^{1/2}$. In this case, the spherical pattern may be easily formed by controlling the solubility parameter difference between the solvent and the first block structural unit of the block copolymer while using a block copolymer having the same molecular weight.

The annealing process may be performed by exposing the block copolymer thin film 14 to the vapor of the solvent for about 30 minutes to about 24 hours. The vapor pressure of the solvent vapor may range from about 0.01 kiloPascal ("kPa") to about 17 kPa. When the annealing process is performed within the vapor pressure range, the swelling ratio may be easily controlled.

The swelling ratio means a ratio of the thickness of an expanded thin film after the annealing process to the thickness of an expanded thin film before the annealing process. The swelling ratio may be accurately measured, and a desired swelling ratio may be obtained by controlling the kind of the solvent and the vapor pressure of the annealing process. Single layer patterns such as lamellar, HPL, cylindrical, and spherical may be realized by controlling the swelling ratio. In short, the morphology and size of the pattern may be controlled. For example, when the first block structural unit is polyvinylpyridine, and acetic acid or pyridine whose solubility parameter is similar to that of polyvinylpyridine is used as the solvent, the solvent is selectively implanted into a polyvinylpyridine block structural unit to maximize the swelling ratio. In this case, the volume fraction of the polyvinylpyridine block structural unit is high and the polyvinylpyridine block structural unit is removed in the subsequent process. As a result, a pattern of a relatively small spherical shape may be obtained. On the other hand, when the expansion by the solvent is minimized, a lamellar pattern may be obtained.

Also, the annealing process maybe performed at a temperature of about 0° C. to about 300° C., specifically about 40° C. to about 300° C., more specifically at room temperature of about 24° C. to about 26° C.

A nano-structure 20 is manufactured by performing a plasma treatment on the thin film containing the pattern 19 and removing the block structural units that do not form the pattern, i.e., selectively leaving the block structural units that form the pattern. A nano-structure pattern 22 is formed, as the nano-structure 20 is formed by removing the first block structural unit 16 having a hydrophilic property through the plasma treatment to provide a space 16', and oxidizing the second block structural unit 18 having a hydrophobic property. As the plasma, oxygen plasma, $CF_4$ plasma, $CHF_3$ plasma, or $SF_6$ plasma may be used.

When a metal is coordinate-bonded with an isolated electron pair of a heteroatom of the first block structural unit 16, a metal may exist in a position 16' where the first block structural unit 16 is removed. Also, after the plasma treatment, a metal oxide may exist in a position 16' where the first block structural unit 16 is removed. A nano-sized metal pattern or metal oxide pattern may thus be obtained without performing a pattern transfer process. The metal may be a transition element, a 13 group element, or a 14 group element. Non-limiting examples of the metal include gold (Au), silver (Ag), platinum (Pt), copper (Cu), nickel (Ni), iron (Fe), titanium (Ti), aluminum (Al), and tin (Sn).

The nano-structured block copolymer obtained as above provides an ultra-fine nanopattern to be applied to the next-generation memory, such as flash and Dynamic Random Access Memory (DRAM), and lithography technology of a logic circuit.

Hereinafter, the embodiments are illustrated in more detail with reference to examples. However, the following are exemplary embodiments and are not limiting.

Examples 1-1 to 5-4: Control of Line Width According to Kind and Vapor Pressure of Solvent A polydimethylsiloxane organic mono-molecular layer is formed by spin-coating a substrate where trenches having a depth of about 40 nm and an area of about 2 micrometers are formed with a polydimethylsiloxane brush solution, performing an annealing process in a vacuum oven at a temperature of about 130° C., and cleaning annealed substrate with toluene. A block copolymer thin film is formed by spin-coating the upper surface of the organic mono-molecular layer with a dispersion solution which is obtained by dispersing poly(2-vinylpyridine)-b-polydimethylsiloxane (PV2P-b-PDMS) having a number average molecular weight of about 26,000 g/mol) in toluene in a concentration of about 1 percent by weight ("wt %"). The solubility parameter difference of the block structural unit of a block copolymer PV2P-b-PDMS is 5.1 $MPa^{1/2}$.

An annealing process is performed onto the block copolymer thin film under the vapor pressure conditions illustrated in the following Table 1 by using a solution shown in Table 1.

After the annealing process, a pattern is formed by performing a $CF_4$ plasma treatment and removing the PV2P block structural unit.

TABLE 1

| | Examples | Solvent used during annealing (solubility parameter of solvent) | Vapor pressure at 25° C. (kPa) | Swelling ratio (SR) | Line width (nm) |
|---|---|---|---|---|---|
| 1 | Example 1-1 | 1-pentenol | 0.259 | 1.417 | 15 |
| 2 | Example 1-2 | (21.7 MPa$^{1/2}$) | | 1.450 | 14.5 |
| 3 | Example 1-3 | | | 1.562 | 9.5 |
| 4 | Example 1-4 | | | 1.714 | 6 |
| 5 | Example 2-1 | Isopropylalcohol | 6.02 | 1.405 | 14 |
| 6 | Example 2-2 | (23.4 MPa$^{1/2}$) | | 1.548 | 10 |
| 7 | Example 2-3 | | | 1.702 | 6 |
| 8 | Example 3-1 | Ethanol | 7.87 | 1.281 | 18 |
| 9 | Example 3-2 | (26.2 MPa$^{1/2}$) | | 1.513 | 16 |
| 10 | Example 3-3 | | | 1.610 | 13 |
| 11 | Example 4-1 | Propylene glycol | 0.02 | 1.19802 | 28.5 |
| 12 | Example 4-2 | (30.7 MPa$^{1/2}$) | | 1.24059 | 25 |
| 13 | Example 4-3 | | | 1.27228 | 24 |
| 14 | Example 4-4 | | | 1.2901 | 22.5 |
| 15 | Example 4-5 | | | 1.44158 | 19 |
| 16 | Example 5-1 | Ethylene glycol | 0.01 | 1.253 | 31 |
| 17 | Example 5-2 | (34.9 MPa$^{1/2}$) | | 1.348 | 28 |
| 18 | Example 5-3 | | | 1.385 | 24 |

In Table 1, the swelling ratio means the ratio of the thickness of an expanded thin film to the thickness of the thin film before the expansion of the thin film. The swelling ratio is controlled according to the solvent vapor exposure time.

Figure 3:
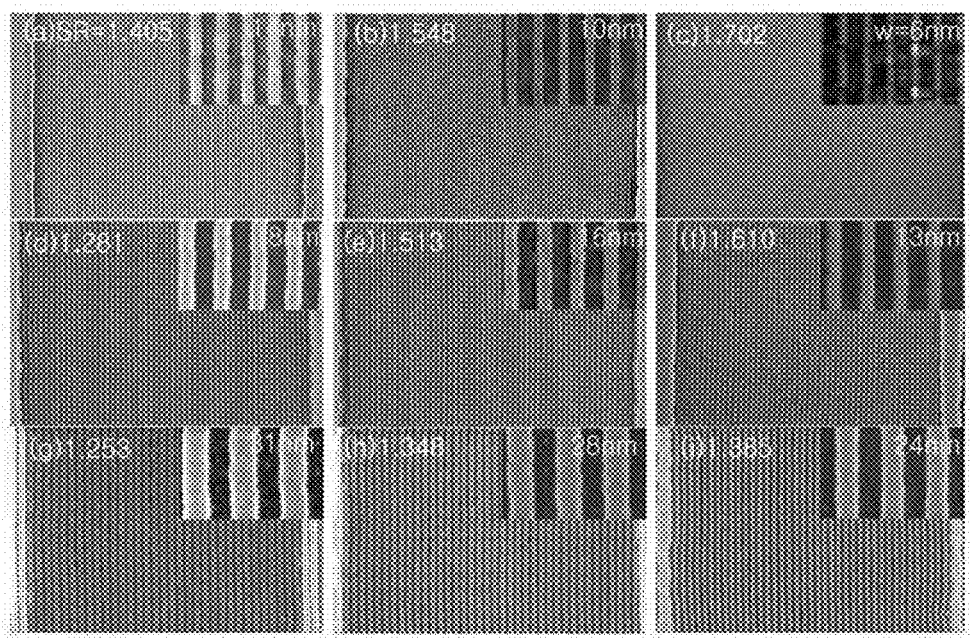
FIG. 3 shows photographs of cylindrical patterns obtained according to Examples 2-1 to 2-3, Examples 3-1 to 3-3, and Examples 5-1 to 5-3.
Figure 4A:
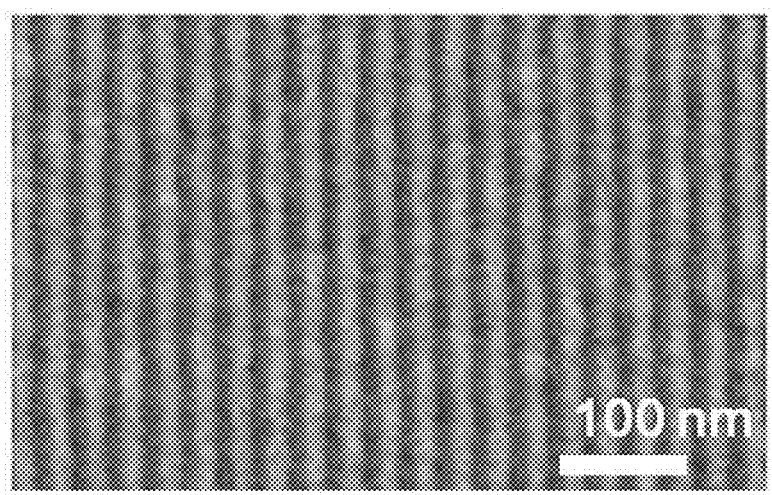
FIGS. 4A to 4D are photographs respectively showing the patterns acquired according to Example 1-1 and Examples 6-1 to 6-3.
Figure 4B:
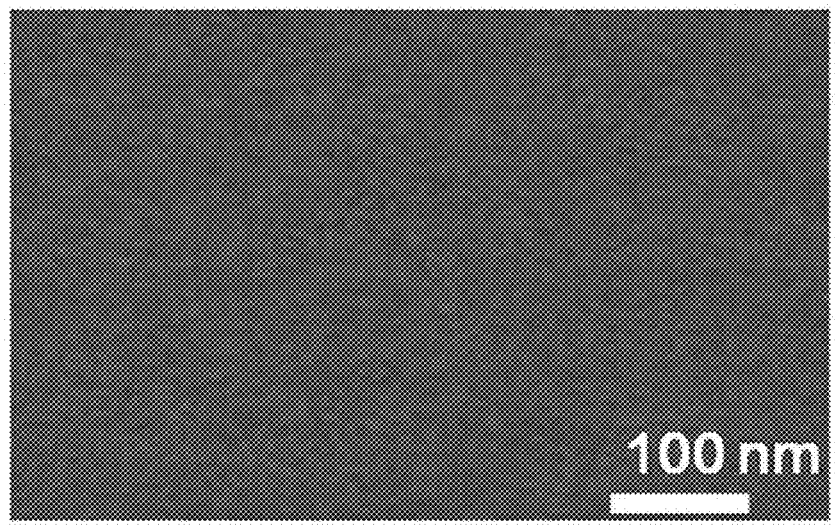
Figure 4C:
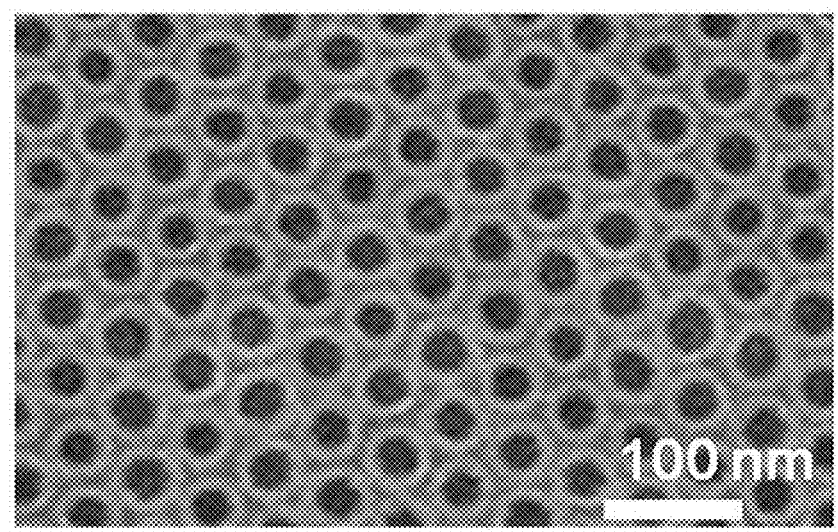
Figure 4D:
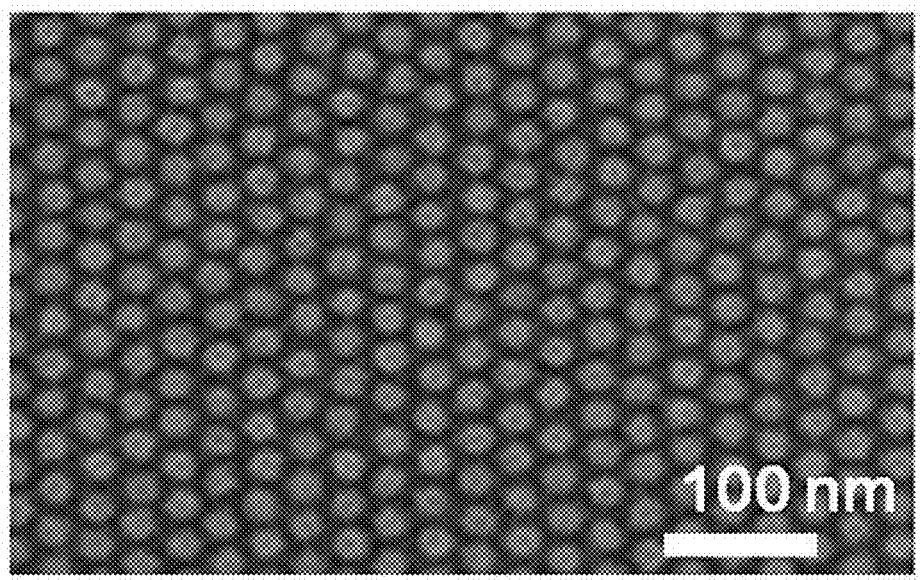

The cylindrical patterns according to Example 2-1 (see (a) of FIG. 3), Example 2-2 (see (b) of FIG. 3), Example 2-3 (see (c) of FIG. 3), Example 3-1 (see (d) of FIG. 3), Example 3-2 (see (e) of FIG. 3), Example 3-3 (see (f) of FIG. 3), Example 5-1 (see (g) of FIG. 3) and Example 5-2 (see (h) of FIG. 3), and Example 5-3 (see (i) of FIG. 3) are shown in FIG. 3, where swelling ratio (SR) is shown in the upper left-hand corner and the line width of each element of the pattern is shown in nanometers in the upper right-hand corner of each of (a), (b), (c), (d), (e), (f), (g), (h), and (i).

As shown in Table 1 and FIG. 3, patterns of diverse sizes may be obtained by controlling the kind and vapor pressure of the solvent. Since the range of line width may be changed in a range of about 6 nm to about 31 nm, structure tenability reaches about 417%. Since such high structure tenability improves the flexibility of the pattern, it simplifies the process and is appropriate for mass production.

Comparative Examples 1-1 to 1-4: Control of Line Width According to Kind and Vapor Pressure of Solvent A polydimethylsiloxane organic mono-molecular layer is formed by spin-coating a substrate where trenches having a depth of about 40 nm and an area of about 1 micromolar ("μm") are formed with a polydimethylsiloxane brush solution, performing an annealing process in a vacuum oven at a temperature of about 130° C., and cleaning the annealed substrate with toluene. A block copolymer thin film is formed by spin-coating the upper surface of the organic mono-molecular layer with a dispersion solution which is obtained by dispersing polystyrene-b-polydimethylsiloxane (PS-b-PDMS) having a number average molecular weight of about 45,500 g/mol in toluene in a concentration of about 1 wt %. The solubility parameter difference of the block structural units of a block copolymer PS-b-PDMS is about 3.0 MPa$^{1/2}$.

An annealing process is performed to the block copolymer thin film under the vapor pressure conditions illustrated in the following Table 2 by using a toluene solvent.

After the annealing process, a pattern is formed by performing a CF$_4$ plasma treatment and removing the PS block structural unit.

TABLE 2

| | Solvent used during annealing (solubility parameter of solvent) | S/V (cm$^{-1}$) | Line width (nm) |
|---|---|---|---|
| Comparative Example 1-1 | toluene (18.3 MPa$^{1/2}$) | 0.571 | 25 |
| Comparative Example 1-2 | | 0.968 | 11 |

In Table 2, S/V denotes the ratio of S (solvent surface area) to V (annealing chamber volume), and the vapor pressure is controlled through an S/V ratio. As shown in Table 2, when a block copolymer whose solubility parameter difference of the block structural units is about 3.0 MPa$^{1/2}$ is used, the line width may be changed in a range of about 11 nm to about 25 nm. Therefore, it may be seen that the structure tenability is about 127%.

Example 1-1 and Examples 6-1 to 6-3: Control of Pattern Morphology According to Kind and Vapor Pressure of Solvent Patterns are formed according to the same method as Examples 1-1 to 5-3 except that the kind and vapor pressure of the solvent used in the annealing process are changed as shown in the following Table 3. The results of Example 1-1 providing a cylindrical pattern are presented together in Table 3.

FIGS. 4A to 4D show scanning electron microscope (SEM) photographs of the resulting patterns.

TABLE 3

| | Examples | Solvent used during annealing (solubility parameter of solvent) | Vapor pressure at 25° C. (kPa) | Swelling ratio | Morphology |
|---|---|---|---|---|---|
| 1 | Example 1-1 | 1-pentenol (21.7 MPa$^{1/2}$) | 0.259 | 1.417 | Cylinder FIG. 4A |
| 19 | Example 6-1 | 1-pentenol (21.7 MPa$^{1/2}$) | 0.259 | 1.140 | Lamellar FIG. 4B) |
| 20 | Example 6-2 | acetic acid (21.4 MPa$^{1/2}$) | 2.07 | 1.351 | HPL FIG. 4C |
| 21 | Example 6-3 | pyridine (21.7 MPa$^{1/2}$) | 2.76 | 2.105 | Sphere FIG. 4D |

As shown in FIGS. 4A to 4D, when an annealing process is performed by using a solvent having a solubility parameter of a similar range, diverse patterns may be obtained by differentiating solvent vapor exposure time and controlling the swelling ratio.

Figure 5:
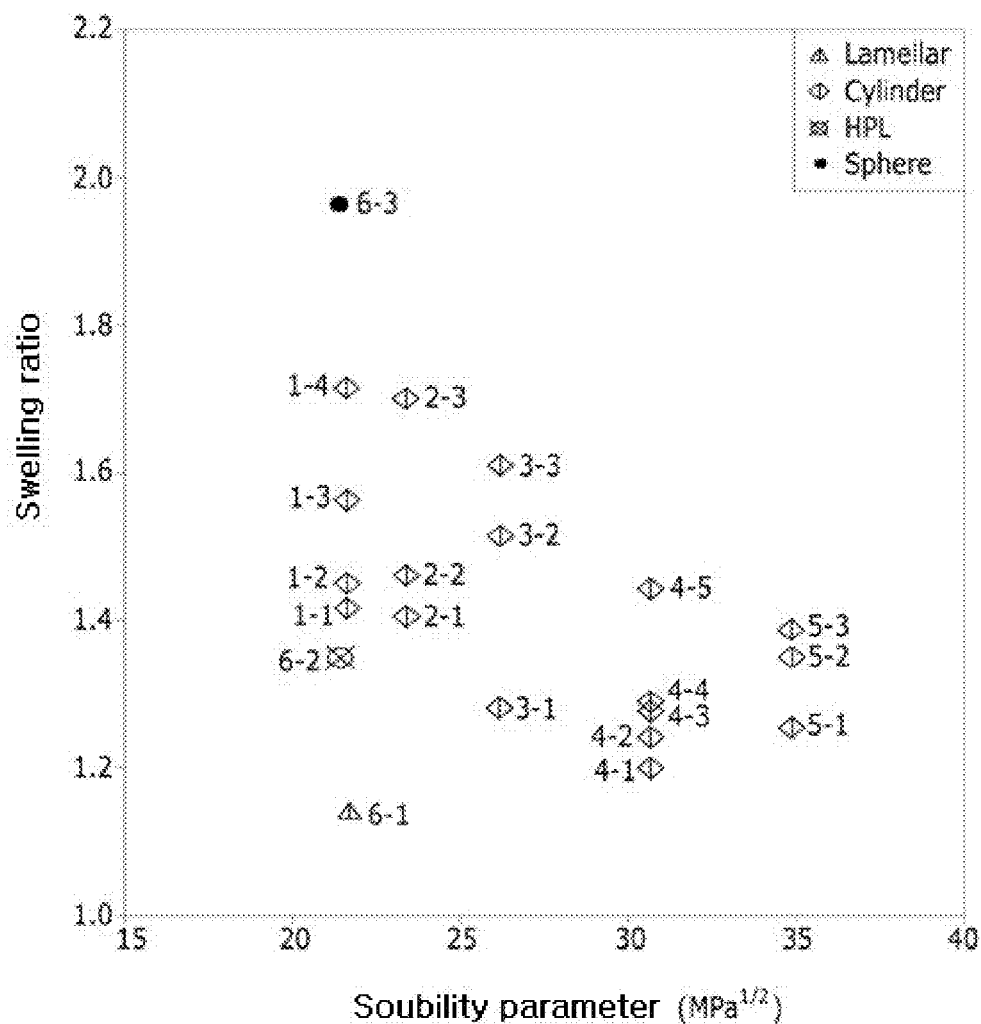
FIG. 5 is a graph showing the standard deviation of sidewall roughnesses of the patterns acquired according to Examples 2-1 to 2-3, Examples 3-1 to 3-3, and Examples 5-1 to 5-3.

FIG. 5 is a graph illustrating the relationship between the swelling ratios and the solubility parameters of the solvents of Examples 1-1 to 6-3 shown in Table 1 and Table 3. It may be seen from FIG. 5 that patterns having diverse sizes and morphologies may be realized by controlling the swelling ratio and the solubility parameter of the solvent.

Figure 6:
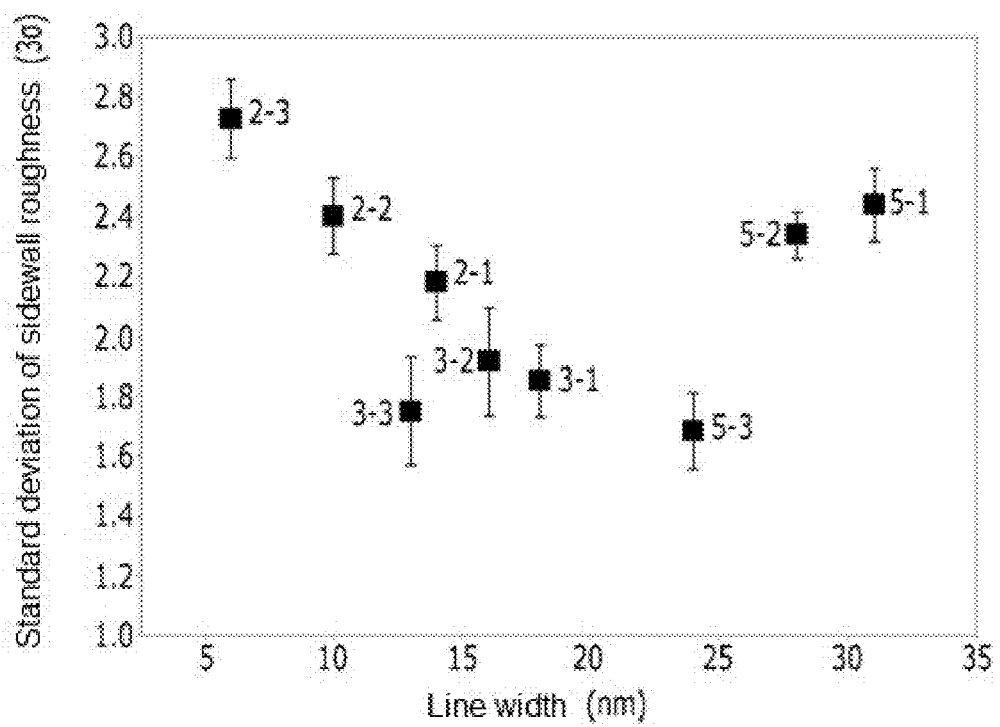
FIG. 6 is a graph showing the standard deviation of sidewall roughness of the patterns obtained according to Examples 2-1 to 2-3, Examples 3-1 to 3-3 and Examples 5-1 to 5-3.

FIG. 6 is a graph illustrating the standard deviation of sidewall roughness (3s, line edge roughness (LER)) of the patterns obtained according to Examples 2-1 to 2-3, Examples 3-1 to 3-3 and Examples 5-1 to 5-3. It may be seen from FIG. 6 that the deviation of the sidewall roughness of the patterns having a line width of diverse sizes is very small. It may be seen that the patterns are formed uniformly.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| Description of Figure Legends | |
|---|---|
| 10: substrate | 12: organic mono-molecular layer |
| 14: block copolymer thin film | 16: first block structural unit |
| 18: second block structural unit | 19: pattern |
| 20: nano-structure | 22: nano-structure pattern |

What is claimed is:

1. A nano-structured block copolymer, consisting of
a self-assembled block copolymer,
wherein the self-assembled block copolymer is disposed on a polymer brush, wherein the polymer brush is disposed on a substrate,
wherein the polymer brush is covalently bonded to the substrate,
wherein the block copolymer comprises a plurality of block structural units, and a solubility parameter difference between at least two block structural units is greater than or equal to about 5 megaPascal$^{1/2}$,
wherein
a first block structural unit of the plurality of block structural units comprises a structural unit represented by Chemical Formula 1 or 2:

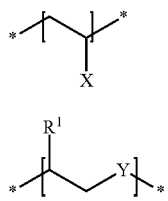

Chemical Formula 1

Chemical Formula 2 wherein, in Chemical Formula 1,
X is selected from a heteroatom-containing aromatic functional group wherein the heteroatom is selected from O, S, and NR (wherein R is hydrogen, a C1 to C20 alkyl group, or a C2 to C20 alkenyl group), a heteroatom-containing alicyclic functional group wherein the heteroatom is selected from O, S, and NRR' (wherein R and R' are independently hydrogen a C1 to C20 alkyl group, or a C2 to C20 alkenyl group), a heteroatom-containing aliphatic functional group wherein the heteroatom is selected from O, S, and NRR' (wherein R and R' are independently hydrogen, a C1 to C20 alkyl group, or a C2 to C20 alkenyl group), a hydrox group (–OH), an amine group (–NRR', wherein R and R' are each independently hydrogen, a C1 to C20 alkyl group, a C2 to C20 C1 to C2 to alkyl group, or a C2 to C20 alkenyl group), a carbonyl group (–C(=O)R, wherein R is hydrogen a C1 to C20 alkyl group, or a C2 to C20 alkenyl group), an ester group (–C(=O)R, wherein R is hydrogen, a C1 to C20 alkyl group, or a C2 to C20 alkenyl group), a cyano group (–CN), a (meth)acryloyloxy group, and a combination thereof, optionally wherein a metal is coordination-bonded with the foregoing functional groups, and in Chemical Formula 2
Y is selected from O, S, and NR wherein R is hydrogen, a C1 to C20 alkyl group, or a C2 to C20 alkenyl group, and
R$^1$ is hydrogen or a methyl group, and
a second block structural unit of the plurality of block structural units comprises a polydiene, a polyolefin, a nylon, or a polysiloxane comprising a C1 to C20 alkyl group or a C6 to C30 aryl group.

2. The nano-structured block copolymer of claim 1, wherein the at least two block structural units have a solubility parameter difference of about 5 megaPascal$^{1/2}$ to about 38 megaPascal$^{1/2}$.

3. The nano-structured block copolymer of claim 1, wherein the block copolymer has a Flory-Huggins interaction parameter ($\chi$) of greater than or equal to about 0.7.

4. The nano-structured block copolymer of claim 1, wherein the first block structural unit of the plurality of block structural units is selected from poly(acrylonitrile), poly(methacrylonitrile), poly(ethylene oxide), poly(propylene oxide), poly(ethylene sulfide), poly(propylene sulfide), poly(ethylene imine), poly(2-vinylpyridine), poly(4-vinylpyridine), poly(methyl(meth)acrylate) and a combination thereof.

5. The nano-structured block copolymer of claim 1, wherein the heteroatom-containing aromatic functional group and heteroatom-containing alicyclic functional group are selected from monovalent or higher valency functional groups represented by Chemical Formula 3:

Chemical Formula 3

 (1)

 (2)

 (3)

 (4)

 (5)

 (6)

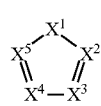 (7)

 (8)

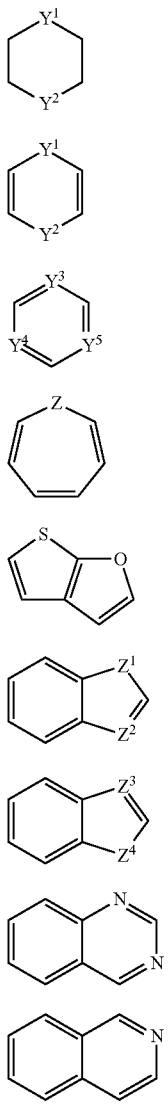

wherein, in (1), (4), (5), and (6) of Chemical Formula 3, X is NR (wherein R is hydrogen, a C1 to C20 alkyl group, or a C2 to C20 alkenyl group), O, and S, in (7) of Chemical Formula 3, $X^1$ is selected from $CR^1R^2$ (wherein $R^1$ and $R^2$ are each independently hydrogen, a C1 to C20 alkyl group, or a C2 to C20 alkenyl group), NR (wherein R is hydrogen, a C1 to C20 alkyl group, or a C2 to C20 alkenyl group), O, and S, and $X^2$ to $X^5$ are N or $CR^1$ (wherein $R^1$ is hydrogen, a C1 to C20 alkyl group, or a C2 to C20 alkenyl group), provided that at least one of $X^2$ to $X^5$ is N when $X^1$ is $CR^1R^2$, in (8) of Chemical Formula 3, $X^1$ is selected from $CR^1R^2$ (wherein $R^1$ and $R^2$ are each independently hydrogen, a C1 to C20 alkyl group, or a C2 to C20 alkenyl group), NR (wherein R is hydrogen, a C1 to C20 alkyl group, or a C2 to C20 alkenyl group), O, and S, and $X^2$ is N or $CR^1$ (wherein $R^1$ is hydrogen, a C1 to C20 alkyl group, or a C2 to C20 alkenyl group), provided that $X^2$ is N when $X^1$ is $CR^1R^2$, in (9) and (10) of Chemical Formula 3, $Y^1$ and $Y^2$ are selected from $CR^1R^2$ (wherein $R^1$ and $R^2$ are each independently hydrogen, a C1 to C20 alkyl group, or a C2 to C20 alkenyl group), NR (wherein R is hydrogen, a C1 to C20 alkyl group, or a C2 to C20 alkenyl group), O, and S, provided that at least one of $Y^1$ and $Y^2$ is NR, O, or S, in (11) of Chemical Formula 3, $Y^3$ to $Y^5$ are selected from $CR^1$ (wherein $R^1$ is hydrogen, a C1 to C20 alkyl group, or a C2 to C20 alkenyl group) and N, provided that at least one of $Y^3$ to $Y^5$ is N, in (12) of Chemical Formula 3, Z is selected from NR (wherein R is hydrogen, a C1 to C20 alkyl group, or a C2 to C20 alkenyl group), O, and S, and in (14) and (15) of Chemical Formula 3, $Z^1$ and $Z^4$ are selected from $CR^1R^2$ (wherein $R^1$ and $R^2$ are each independently hydrogen, a C1 to C20 alkyl group, or a C2 to C20 alkenyl group), N, O, and S, and $Z^2$ and $Z^3$ are selected from $CR^1$ (wherein $R^1$ is hydrogen, a C1 to C20 alkyl group, or a C2 to C20 alkenyl group) and N, provided that $Z^2$ and $Z^3$ are N when $Z^1$ and $Z^4$ are $CR^1R^2$, and $Z^1$ and $Z^4$ are selected from N, O, and S when $Z^2$ and $Z^3$ are $CR^1$.

6. The nano-structured block copolymer of claim 1, wherein the block copolymer comprises one selected from polyacrylonitrile-b-polydimethylsiloxane, polyethyleneoxide-b-polydimethylsiloxane, poly(2-vinylpyridine)-b-polydimethylsiloxane, poly(4-vinylpyridine)-b-polydimethylsiloxane, polymethylmethacrylate-b-polydimethylsiloxane, polyacrylonitrile-b-polypropylene, polyethyleneoxide-b-polypropylene, polyacrylonitrile-b-polyisobutylene, polyethyleneoxide-b-polyisobutylene, polyacrylonitrile-b-polyethylene, polyethyleneoxide-b-polyethylene, polyacrylonitrile-b-polyisoprene, polyethyleneoxide-b-polyisoprene, polyacrylonitrile-b-poly(meth)acrylate, polyethyleneoxide-b-poly(meth)acrylate, polyacrylonitrile-b-polychloroprene, polyethyleneoxide-b-polychloroprene, and a combination thereof.

7. The nano-structured block copolymer of claim 1, wherein a weight ratio of the first block structural unit to the second block structural unit is about 10:90 to about 90:10.

8. The nano-structured block copolymer of claim 1, wherein a weight ratio of the first block structural unit to the second block structural unit is about 30:70 to about 70:30.

9. The nano-structured block copolymer of claim 1, wherein the block copolymer has a number average molecular weight of about 5,000 Daltons to about 100,000 Daltons.

10. The nano-structured block copolymer of claim 1, wherein the block copolymer has polydispersity index of about 1 to about 1.2.

11. The nano-structured block copolymer of claim 1, wherein the polymer brush is selected from a polysiloxane, a substituted polystyrene, a poly(meth)acrylate, a polystyrene-random-poly(methylmethacrylate), and a combination thereof.

12. The nano-structured block copolymer of claim 1, wherein the polymer brush is a polysiloxane.

* * * * *